(12) United States Patent
Kawanami et al.

(10) Patent No.: US 9,087,675 B2
(45) Date of Patent: Jul. 21, 2015

(54) EMITTER, GAS FIELD ION SOURCE, AND ION BEAM DEVICE

(75) Inventors: Yoshimi Kawanami, Tokyo (JP);
Hironori Moritani, Tokyo (JP);
Hiroyuki Muto, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/238,718

(22) PCT Filed: Jun. 20, 2012

(86) PCT No.: PCT/JP2012/065676
§ 371 (c)(1),
(2), (4) Date: Feb. 12, 2014

(87) PCT Pub. No.: WO2013/035411
PCT Pub. Date: Mar. 14, 2013

(65) Prior Publication Data
US 2014/0191128 A1   Jul. 10, 2014

(30) Foreign Application Priority Data
Sep. 5, 2011   (JP) .................................. 2011-192272

(51) Int. Cl.
*G21K 5/04*   (2006.01)
*H01J 37/26*  (2006.01)
*H01J 37/08*  (2006.01)
*H01J 9/50*   (2006.01)

(52) U.S. Cl.
CPC . *H01J 37/26* (2013.01); *H01J 9/50* (2013.01); *H01J 37/08* (2013.01); *H01J 2237/0807* (2013.01)

(58) Field of Classification Search
USPC ......... 850/52, 56, 57, 59, 60; 250/309, 492.1, 250/492.3, 423 R, 424, 423 F, 423 P
See application file for complete search history.

(56) References Cited

U.S. PATENT DOCUMENTS

2010/0219339 A1*   9/2010   Ogawa et al. ................. 250/306

FOREIGN PATENT DOCUMENTS

| JP | 7-192669 A    | 7/1995 |
| JP | 10-092361 A   | 4/1998 |
| JP | 2008-140557 A | 6/2008 |
| JP | 2010-205426 A | 9/2010 |

OTHER PUBLICATIONS

International Search Report issued in International Application No. PCT/JP2012/065676 issued Oct. 2, 2012.

* cited by examiner

*Primary Examiner* — Nicole Ippolito
(74) *Attorney, Agent, or Firm* — McDermott Will & Emery LLP

(57) ABSTRACT

Provided is an ion source emitter that does not cause significant extraction voltage changes even when an apex portion of the emitter is repeatedly regenerated. The emitter has a shape of a triangular pyramid with the single atom at the apex. An apex portion of the emitter is substantially shaped like a hexagon when viewed from the apex side.

17 Claims, 6 Drawing Sheets

EMITTER, GAS FIELD ION SOURCE, AND ION BEAM DEVICE

RELATED APPLICATIONS

This application is the U.S. National Phase under 35 U.S.C. §371 of International Application No. PCT/JP2012/065676, filed on Jun. 20, 2012, which in turn claims the benefit of Japanese Application No. 2011-192272, filed on Sep. 5, 2011, the disclosures of which Applications are incorporated by reference herein.

TECHNICAL FIELD

The present invention relates to an emitter suitable for use as a gas field ion source, a gas field ion source, and an ion beam device based on the gas field ion source.

BACKGROUND ART

A focused ion beam (FIB) device that includes a gas field ion source and uses hydrogen, helium, neon, or other gas ions is generally known. Unlike a gallium FIB from a frequently used liquid metal ion source, a gas FIB is a device that does not contaminate a sample with gallium. Further, the gas field ion source generates gas ions having a narrow energy width and is small in ion generation source size. Therefore, the gas field ion source is capable of forming a finer beam than a gallium liquid metal ion source.

Furthermore, the gas field ion source has an emitter, which emits ions, and an extraction electrode, which is disposed opposite the emitter, and emits ions by applying a voltage between the emitter and the extraction electrode. It is known that the performance of an ion source improves due, for instance, to an increase in the angular current density of the ion source when a micro-protrusion is formed on the apex of the emitter of the gas field ion source. It is also known that the micro-protrusion can be formed by sharpening the apex of a base part of the emitter, which is formed of single crystal tungsten, by means of field evaporation (refer, for instance, to Patent Literature 1). It is further known that the micro-protrusion can also be formed by using a second metal, which is different from a first metal used as the base part of the emitter (refer, for instance, to Patent Literature 2). In this case, a noble metal (e.g., iridium or platinum) is used as the second metal while tungsten is used as the first metal.

The micro-protrusion of the emitter breaks within a certain period of time as it is affected by an impurity gas in the gas field ion source. If the micro-protrusion of the emitter can be regenerated in the ion source, the phenomenon of such breakage does not limit the operational lifetime of the emitter so that the ion source can be used in a substantially continuous manner. Meanwhile, when a noble metal is used as the second metal, the micro-protrusion (pyramid structure) can be regenerated simply by heating as far as the noble metal remains undepleted.

CITATION LIST

Patent Literatures

Patent Literature 1: Japanese Unexamined Patent Application Publication No. Hei7(1995)-192669
Patent Literature 2: Japanese Unexamined Patent Application Publication No. 2008-140557

SUMMARY OF INVENTION

Technical Problem

However, when the micro-protrusion is regenerated, an ion extraction voltage changes by more than several percent. As this makes it necessary to adjust the axis of the ion optical system of an ion beam device, the ion source cannot be used in a substantially continuous manner. Moreover, the axis adjustment of the ion optical system is a time-consuming, complicated task. As for the emitter on which the micro-protrusion (pyramid structure) is formed by heating a noble metal disposed on the base part formed of single crystal tungsten, a similarly shaped micro-protrusion can be regenerated on the apex of the emitter by heating (refer to Patent Literature 2). However, when the emitter is repeatedly regenerated, the resulting accumulated extraction voltage change reaches a level of several percent, making it necessary to adjust the axis of the ion optical system.

The present invention has been made to solve the above problem. An object of the present invention is to provide an emitter that permits an insignificant accumulated change of ion extraction voltage even when the micro-protrusion is repeatedly regenerated. Another object of the present invention is to provide a gas field ion source and an ion beam device that use the emitter.

Solution to Problem

To solve the above problem, the apex of the emitter for the gas field ion source is shaped so as to permit the convergence of thermal changes. More specifically, the apex portion of the emitter having a base part formed of a single crystal metal is shaped like a triangular pyramid. Further, when viewed from the apex side, the apex portion is substantially shaped like a hexagon.

Advantageous Effects of Invention

According to the present invention, even when the micro-protrusion of the emitter is regenerated, the ion extraction voltage does not vary to the extent that the axis of the ion optical system needs to be adjusted. This increases the availability of the gas field ion source and of the ion beam device that uses it. Consequently, the present invention provides such an advantage as to substantially increase the lifetime of the emitter.

DESCRIPTION OF EMBODIMENTS

The configuration of an emitter according to an embodiment of the present invention will now be described with reference to FIGS. 1 to 5.

First of all, the configuration of an apex portion of the emitter according to the present embodiment will be described with reference to FIG. 1.

Figure 1:
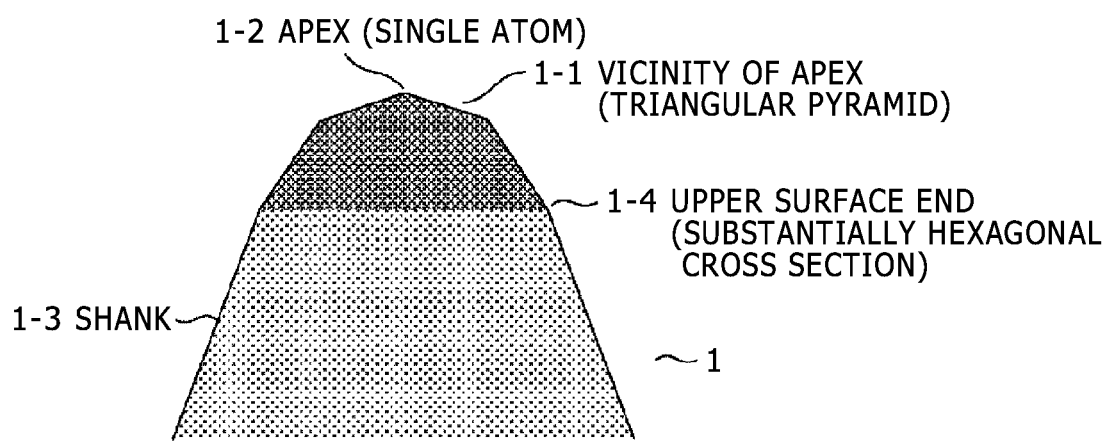
FIG. 1 is a diagram illustrating the configuration of an apex portion of an emitter according to an embodiment of the present invention.

FIG. 1 is a diagram illustrating the configuration of the apex portion of the emitter according to the present embodiment.

The emitter 1 according to the present embodiment is such that its base part is formed of single crystal tungsten. The surface of the single crystal tungsten is coated with iridium, which is a noble metal. The emitter has a base part, which is formed of a single crystal metal, and a needle-like apex portion. FIG. 1 shows an apex portion that is a part of approximately 1 μm from the apex of the emitter.

The method of manufacturing the emitter is outlined below. The apex portion of a thin wire formed of single crystal tungsten (usually 0.1 to 0.3 mm in diameter) having a crystal orientation [111] aligned in axial direction is sharpened by electropolishing. Next, a cleaning process (field evaporation process in this instance) is performed to remove impurities from the surface of the apex portion. The surface of the apex portion is then coated with a substantially monatomic layer of iridium (by performing a sputter deposition process in this instance). Subsequently, the surface of the apex portion is annealed in an appropriate manner. The vicinity of the apex of the emitter is then shaped like a triangular pyramid as a crystal face (211) is expanded. When an appropriate annealing process is further performed, the apex 1-2 becomes a single atom. The above-mentioned phase can be confirmed by observing a field-ion microscope (FIM) image of the apex portion of the emitter. It should be noted that a basic sequence of processes is described above. In reality, there are a number of variations.

The shape of the apex portion of the emitter, that is, the triangular pyramid, may be broken through the use of an ion source. In such an instance, a regeneration process can be performed to reshape the emitter. The regeneration process is performed to restore the shape of the broken apex portion of the emitter to the shape of a triangular pyramid. More specifically, one of some regeneration methods is to perform an annealing process again in high vacuum. In some cases, this process may include a process for adding an emitter material by means of vapor deposition. However, the annealing process is an essential part.

The present embodiment is characterized by a phase between the vicinity 1-1 of the apex of the emitter 1 and the shank 1-3 thereof. More specifically, the present embodiment is characterized in that the upper surface of the emitter 1 as viewed from the apex side, namely, the upper surface end portion 1-4, is substantially shaped like a hexagon. The upper surface end portion 1-4 of a conventional emitter of the same type is substantially shaped like a circle. The above-mentioned phase can be confirmed by observing a scanning electron microscope (SEM) image of the apex portion of the emitter. It can be said that the shape of the upper surface of the emitter 1 as viewed from the apex side is the shape of the apex portion of the emitter as viewed from an extraction electrode side while the emitter 1 is mounted on a gas field ion source. It can also be said that the shape of the upper surface of the emitter 1 as viewed from the apex side is the shape of a cross section as viewed from a certain distance from the apex 1-2 of the emitter 1.

The shape of the emitter 1 shown in FIG. 1 is a shape obtained when thermal deformation is converged. Even when the emitter 1 is further annealed, the resulting state is a state where at least the changes of ion extraction voltage are converged. This matter is described below.

Figure 2:
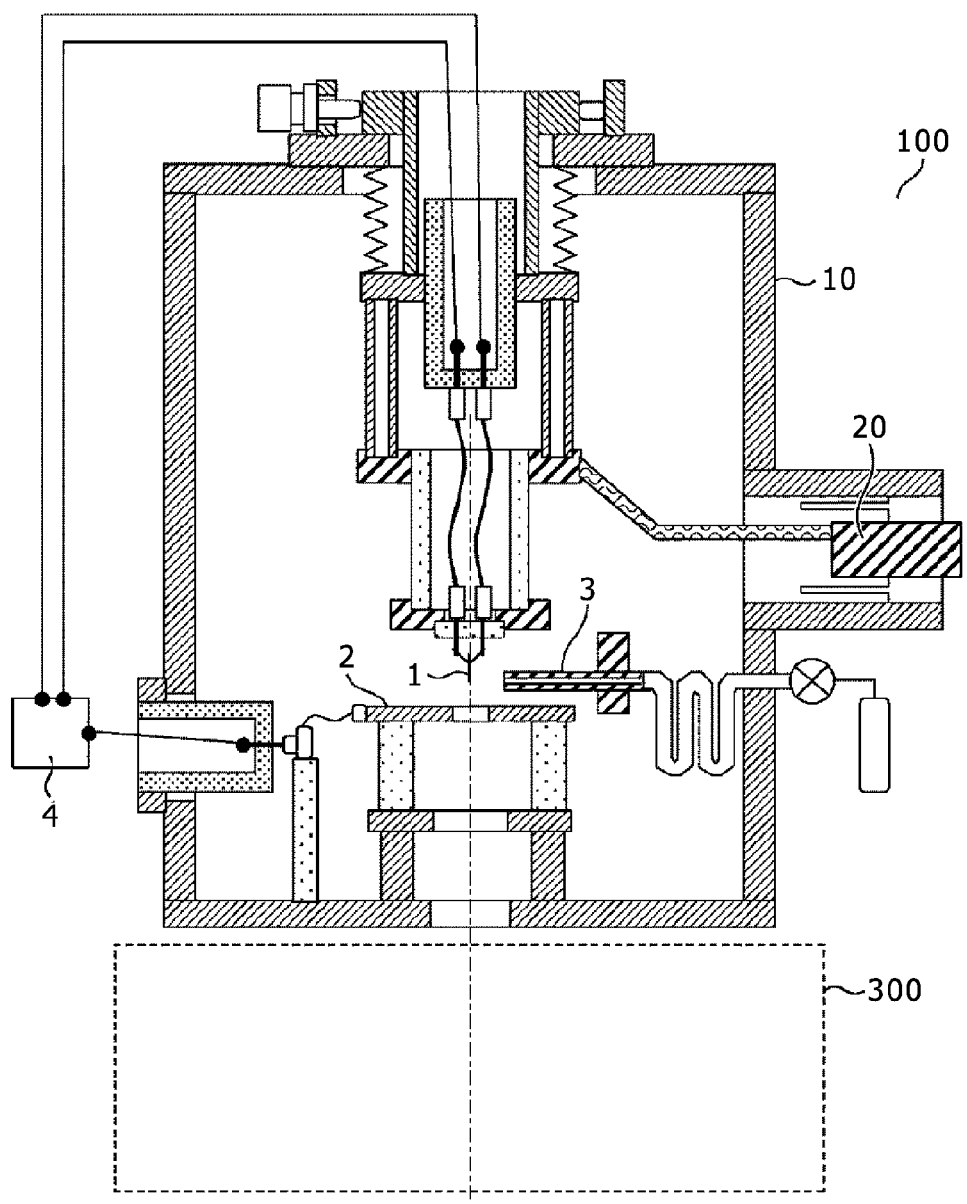
FIG. 2 is a diagram illustrating the configuration of a gas field ion source according to the embodiment of the present invention.

FIG. 2 is a diagram illustrating the configuration of the gas field ion source according to the embodiment of the present invention.

When helium gas is supplied from a gas emission port 3 while an extraction voltage for placing the emitter at a positive potential is applied between the emitter 1 (with its apex positioned in a lower position in FIG. 2) and an extraction electrode 2 inside a vacuum vessel 10, the helium gas is ionized to emit an ion beam of helium from the apex of the emitter 1. The emitter 1 is connected to an extraction voltage application section 4 for electrical heating and extraction voltage application. The temperature of the emitter 1 is controlled by means of thermal transfer cooling from a cooling head 20. Here, the gas to be ionized is not limited to helium. A rare gas such as neon or helium and hydrogen gas may be used as far as the temperature of the emitter is properly controlled in accordance with the gas.

Figure 3:
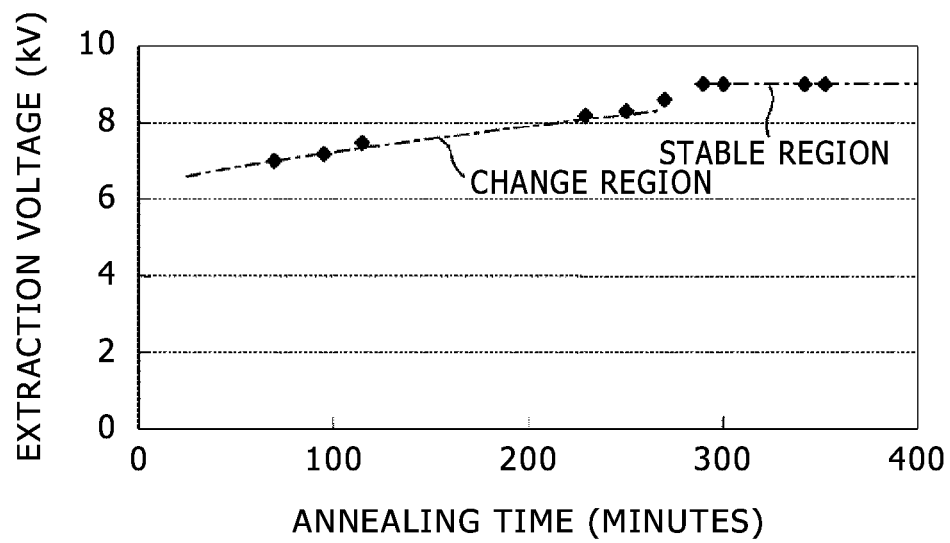
FIG. 3 is a graph illustrating extraction voltage changes that occur when the emitter is annealed a number of times in the gas field ion source according to the embodiment of the present invention.

FIG. 3 is a graph illustrating how the emitter 1 according to the embodiment of the present invention was produced. In this graph, the horizontal axis represents the cumulative annealing time for the emitter 1 (which is required for structuring the apex portion of the emitter 1), and the vertical axis represents the extraction voltage for the emitter 1 (which is required for ion emission). Annealing was conducted at a temperature of approximately 930° C. As the extraction voltage for helium ions, a voltage at which an FIM image of the apex of the emitter 1 was clearly visible was plotted while the temperature of the emitter 1 was 25 K.

The first plot was obtained by measuring the extraction voltage with helium gas introduced after a triangular pyramid structure is formed at the apex of the emitter 1 in ultrahigh vacuum. The subsequent plots were obtained by discharging the gas and annealing in ultrahigh vacuum to regenerate the triangular pyramid structure after atoms at the apex of the emitter were intentionally removed by means of field evaporation and by introducing the gas again to measure the extraction voltage. The annealing time for regeneration was appropriately determined for each annealing process. The graph in FIG. 3 indicates that the extraction voltage changes although the triangular pyramid structure is formed at the apex of the emitter 1 due to repeated regeneration based on annealing. A region in which the extraction voltage changes as indicated above with the cumulative annealing time is called a change region. However, when the cumulative annealing time was further prolonged, it was found that a transition occurred from the change region where the extraction voltage changes to a stable region where the extraction voltage remains unchanged without regard to the cumulative annealing time. Hence, an SEM image showing the shape of the emitter in the change region was compared against an SEM image showing the shape of the emitter in the stable region. As described later, the emitter in the stable region does not exhibit a significant voltage change during annealing in the regeneration process. Even the cumulative voltage change is approximately 1% (substantially equivalent to measurement variations). Therefore, the stable region can be defined by the amount of extraction voltage difference between before and after the regeneration process. Accordingly, it can be said that the stable region according to the present embodiment is a region where the amount of extraction voltage difference between before and after the regeneration process is not greater than 1%.

Figure 4A:
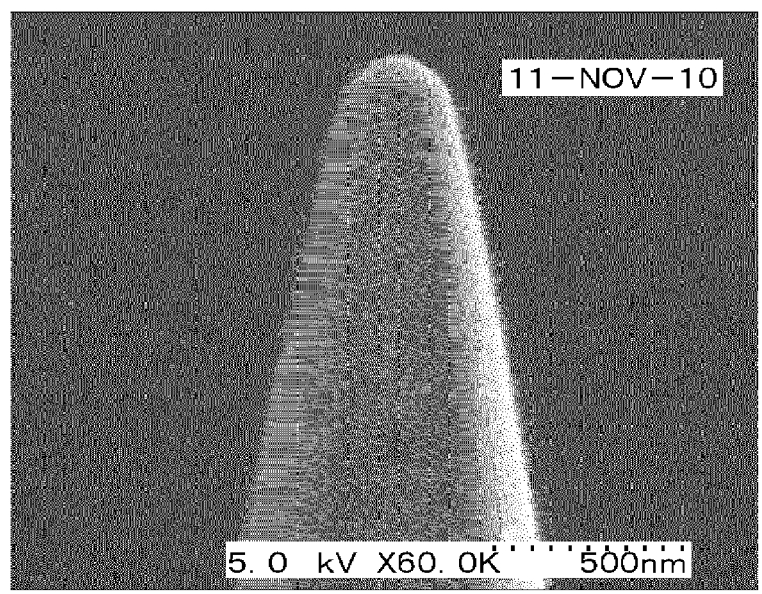
FIG. 4A is a scanning electron micrograph showing a lateral surface of the apex portion of the emitter according to the embodiment of the present invention.
Figure 4B:
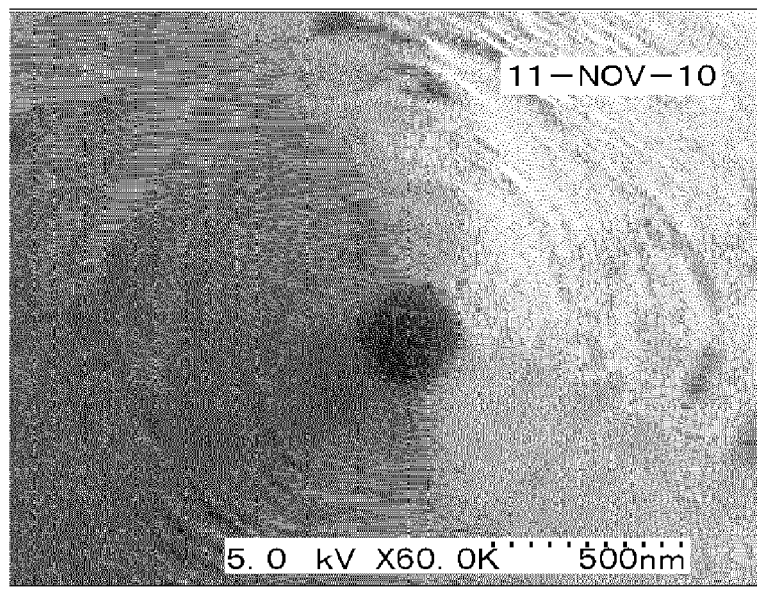
FIG. 4B is a scanning electron micrograph showing an upper surface of the apex portion of the emitter according to the embodiment of the present invention as viewed from the apex side.
Figure 5A:
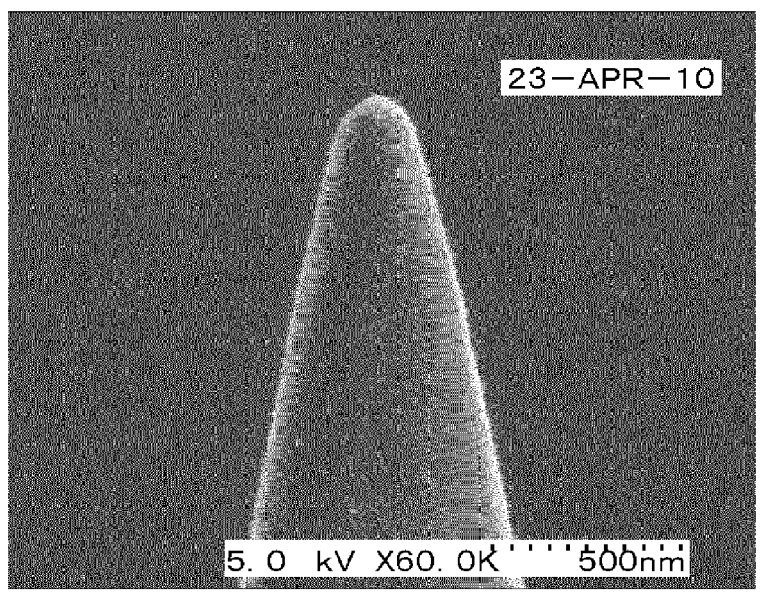
FIG. 5A is a scanning electron micrograph showing a lateral surface of the apex portion of a conventional emitter.
Figure 5B:
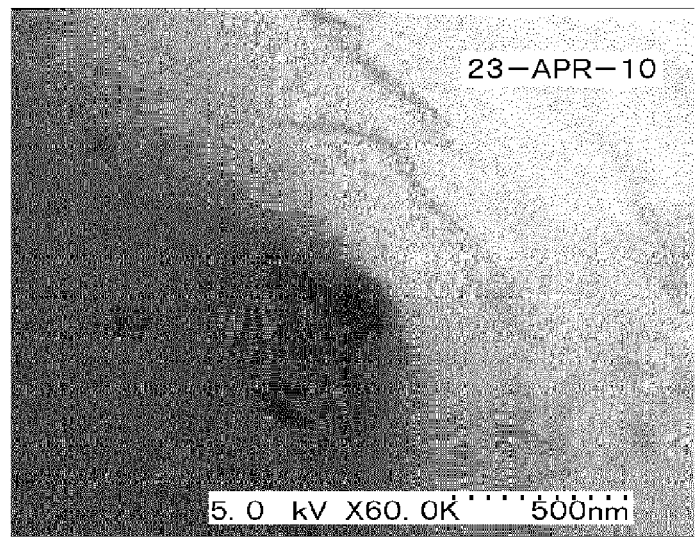
FIG. 5B is a scanning electron micrograph showing an upper surface of the apex portion of the conventional emitter as viewed from the apex side.

FIGS. 4(A) and 4(B) are SEM images of the emitter annealed until the stable region is reached. FIG. 4(A) shows a lateral image of the emitter, whereas FIG. 4(B) shows an image of the apex portion of the emitter as viewed from the apex side. Meanwhile, FIGS. 5(A) and 5(B) are SEM images of the emitter in the change region. FIG. 5(A) shows a lateral image of the emitter, whereas FIG. 5(B) shows an image of the apex portion of the emitter as viewed from the apex side. Formerly, it was unknown that the stable region existed depending on the cumulative annealing time. Therefore, the emitter was formerly used in a state shown in FIGS. 5(A) and 5(B). The comparison between these figures indicates that the shape of the upper surface end portion of the emitter as viewed from the apex side varies depending on whether the emitter is in the stable region or in the change region. The emitter in the stable region is substantially shaped like a hexagon. However, the emitter in the change region is substantially shaped like a circle. In other words, it is revealed that even if the vicinity of the apex of the emitter is shaped like a triangular pyramid, the extraction voltage changes unless shape changes near the upper surface end portion converge.

The gas field ion source based on the emitter according to the present embodiment is used after the emitter is formed until it is placed in the stable region. Whether or not the emitter is in the stable region is determined depending on the length of the cumulative annealing time or the amount of extraction voltage changes with respect to the cumulative annealing time. This makes it possible to suppress extraction voltage changes to a greater extent than before regeneration even if the shape of the apex of the emitter is regenerated when it is broken by the use of the ion source. The same advantage is obtained even when the emitter is formed by a separate device until the emitter is placed in the stable region and then mounted in the gas field ion source. This method provides an advantage in that it reduces the period of time during which the gas field ion source is occupied. In addition to the above-described method related to annealing conditions, various other methods may be used to reduce the time required for forming the emitter until it is placed in the stable region. However, it is essential that the upper surface end portion 1-4 of the apex portion of the emitter be eventually shaped to have a substantially hexagonal cross section.

It is assumed, as mentioned above, that the base part of the emitter according to the present embodiment is formed of single crystal tungsten. However, any material may be used as far as the apex portion of the emitter 1 can be shaped like a triangular pyramid. For example, a single crystal of molybdenum or other high melting point metal may alternatively be used. It is preferred that the employed material be unlikely to peel off in an electric field. According to common knowledge, tungsten is the most suitable material. Further, it is assumed in the present embodiment that the surface of the base part of the emitter is coated with iridium, which is a noble metal. However, platinum, palladium, platinum, or other noble metal may alternatively be used for coating purposes as far as the apex portion of the emitter can be shaped like a triangular pyramid when it is annealed together with the base part. However, as the atoms of the apex are of the employed noble metal, it preferred that the employed noble metal be unlikely to peel off in an electric field. Hence, according to common knowledge, iridium is the most suitable material.

Figure 6:
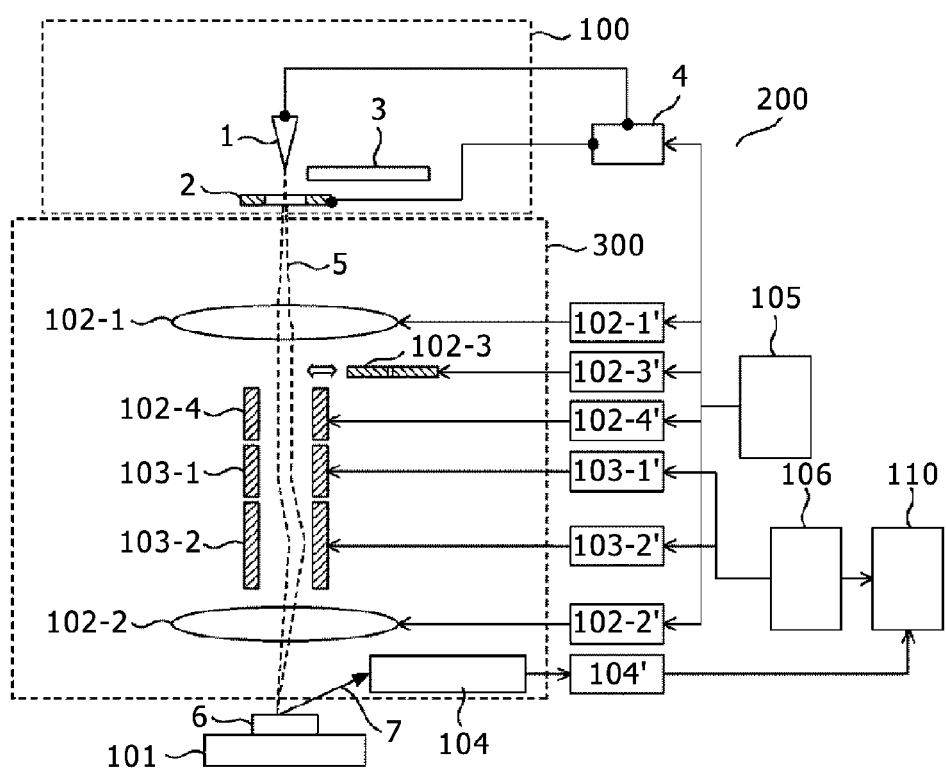
FIG. 6 is a diagram illustrating the overall configuration of an ion beam device according to the embodiment of the present invention.

FIG. 6 is a diagram illustrating the overall configuration of an ion beam device according to the present embodiment.

The ion beam device 200 includes the aforementioned gas field ion source 100 and an ion optical system 300. The gas field ion source 100 includes the emitter 1, the extraction electrode 2 disposed opposite the emitter, and the gas emission port 3, which emits a gas supplied from a gas supply piping into a space between the apex of the emitter 1 and the extraction electrode 2. The ion optical system 300, which focuses an emitted ion beam 5 on a sample to irradiate the sample with the ion beam 5, includes electrostatic lenses 102-1, 102-2, an aligner 102-4, deflectors 103-1, 103-2, and a beam limiting aperture 102-3. These devices included in the ion optical system 300 are controlled by a lens system controller 105 and by a deflection system controller 106 through control circuits 102-1', 102-3', 102-4', 103-1', 103-2', 102-2' that are respectively provided therefor.

When the sample 6 secured to a sample stage 101 is irradiated with the ion beam 5 through the ion optical system 300, secondary electrons 7 having information about the sample are emitted from the sample. The secondary electrons 7 are detected by a secondary electron detector 104. A detection signal from the secondary electron detector 104 is input to an image generation section 104' through an analog-to-digital converter. The detection signal is then associated with an irradiation position of the ion beam 5 by the image generation section 104' to generate an image of the sample. The generated image of the sample appears on a display or other indicator 110.

When the axis of the ion optical system needs to be adjusted due to a change in the ion extraction voltage, it is necessary to perform various complicated tasks, such as the horizontal position adjustments of the emitter 1 and of the beam limiting aperture 102-3, the intensity adjustment of the aligner 102-4, and the offset adjustments of the deflectors 103-1, 103-2. Some of the tasks can be automatically controlled by a computer (not shown) that provides integrated control of the lens system controller 105 and the deflection system controller 106. However, the availability of the device decreases depending on the time required to perform the tasks because a user has to view a scanned ion image and formulate a judgment or manually make mechanical position adjustments.

Figure 7:
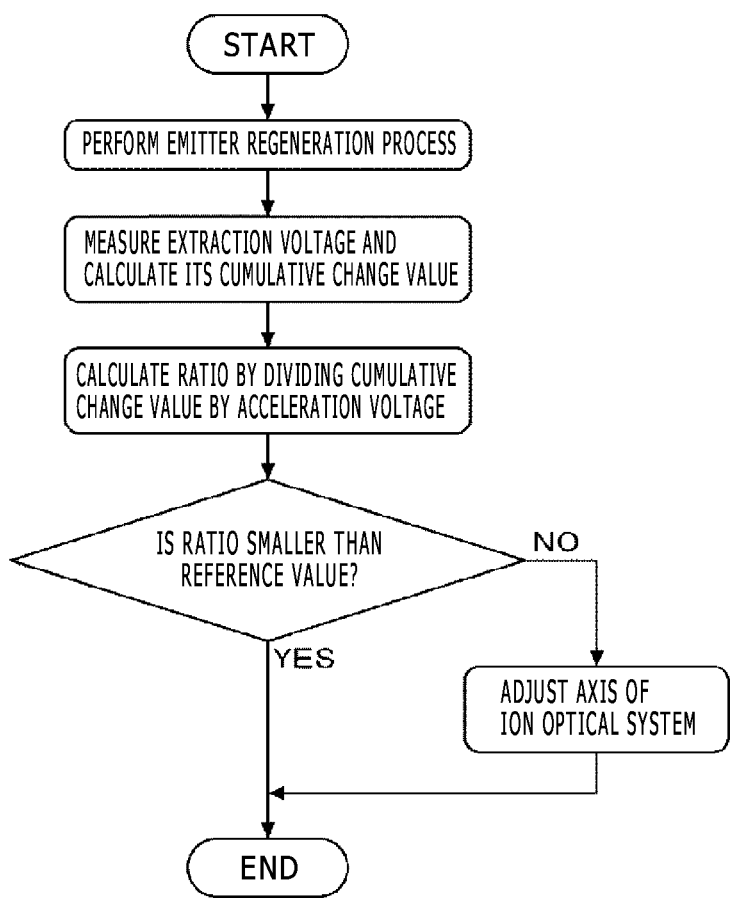
FIG. 7 is a flowchart illustrating a sequence of processes including the regeneration of the emitter in the ion beam device according to the embodiment of the present invention.

As shown in FIG. 3, the emitter in the stable region does not exhibit a significant voltage change during regenerative annealing. Even the cumulative voltage change is approximately 1% (substantially equivalent to measurement variations). In a situation where such insignificant voltage changes are encountered, it is not necessary to readjust the axis of the ion optical system 300 under normal conditions. However, if the acceleration voltage of the ion optical system 300, that is, the energy of the ion beam 5 reaching the sample 6, is substantially equal to the ion extraction voltage, an influence may be exerted even when the above-mentioned extraction voltage change arises. This makes it necessary to determine, in accordance with the ratio of the extraction voltage change to the acceleration voltage, whether or not to readjust the axis of the ion optical system 300. When the ion beam device is based on a conventional emitter is used, it is essential that the axis be adjusted after the regeneration process. However, when the ion beam device according to the present embodiment is used, whether or not the axis adjustment is needed can be determined by making a later-described extraction voltage comparison. If the extraction voltage change is very small, the axis adjustment need not be made. A processing sequence shown, for instance, in FIG. 7, which includes an emitter regeneration process, is programmed in the aforementioned computer (not shown) according to the present embodiment. After the regeneration process is performed for the apex of the emitter, the extraction voltage is measured to calculate the value of a cumulative change in the extraction voltage.

The value of the cumulative change is the amount of change in the emitter extraction voltage prevailing after the regeneration process with respect to the emitter extraction voltage prevailing at a reference point of time. The time of manufacture of the apex of the emitter, the time immediately following the last regeneration process, or any other arbitrary point of time may be set the reference point of time. However, if the reference point of time is selected from within the aforementioned change region, the value of the cumulative change is increased. Therefore, it is preferred that the reference point of time be a point of time after the emitter is placed in the stable region.

Next, the ratio obtained by dividing the cumulative change value by the acceleration voltage is calculated. If the calculated ratio is smaller than a threshold value, processing terminates. If, on the other hand, the calculated ratio is greater than the threshold value, processing terminates after an axis adjustment process is performed for the ion optical system. In the present embodiment, the threshold value is set to 1%. The reason is that, as mentioned earlier, when the reference point of time is a point of time after the emitter is placed in the stable region, the cumulative change caused by the regeneration process is not greater than 1% after the regeneration process is repeated a number of times. If the acceleration voltage is as low as 5 kV, the axis needs to be adjusted after the regeneration process for the emitter has been performed approximately once out of ten. However, such an axis adjustment does not bother the user as the amount of adjustment is small.

Other Exemplary Embodiments

While the invention has been described in conjunction with a presently preferred embodiment, the method of shaping the apex portion of the emitter like a triangular pyramid is not limited to the one described in the foregoing embodiment. For example, the triangular pyramid may be formed by annealing the apex portion of the emitter in ultrahigh vacuum while applying a positive electric field to the apex of single crystal tungsten. In this instance, too, the apex portion of the emitter on which thermal changes are converged is substantially shaped like a hexagon when the apex is viewed from above (as viewed from the apex side). Further, the apex portion of the emitter can be shaped like a quadrangular pyramid by selecting an appropriate crystal orientation for the single crystal metal of the base part of the emitter. In this instance, it can easily be analogized that the apex portion of the emitter on which thermal changes are converged is substantially shaped like an octagon when the apex is viewed from above.

LIST OF REFERENCE SIGNS

1 Emitter
2 Extraction electrode
3 Gas emission port
4 Extraction voltage application section
5 Ion beam
6 Sample
7 Secondary electrons
10 Vacuum vessel
20 Cooling head
100 Gas field ion source
101 Sample stage
102-1, 102-2 Electrostatic lens
102-3 Beam limiting aperture
102-4 Aligner
103-1, 103-2 Deflector
104 Secondary electron detector
105 Lens system controller
106 Deflection system controller
110 Indicator
200 Ion beam device
300 Ion optical system

The invention claimed is:

1. An emitter used with an ion source of an ion beam device, the emitter comprising:
    a base part formed of a single crystal metal; and
    a needle-like apex portion formed on the base part,
    wherein the apex portion comprises a pyramid portion having an apex point, and a middle portion located between the pyramid portion and the base part, and
    wherein the pyramid portion is a structure shaped like a triangular pyramid, and
    a cross section of the emitter at a line dividing the middle portion and the base part is substantially shaped like a hexagon.

2. The emitter according to claim 1,
    wherein, when the structure of the apex portion is broken, the apex portion can be regenerated by performing a regeneration process that includes an annealing step.

3. The emitter according to claim 1,
    wherein the cross section shape is a shape of the apex portion viewed from the apex point side by scanning electron microscope image.

4. The emitter according to claim 1,
    wherein the cross section shape is at a point within 1 μm from the apex point.

5. The emitter according to claim 1,
    wherein the cross section dividing the middle portion and the base part is at a point at which a slope of the emitter, in a side view, changes when the emitter is seen from the base part toward the apex portion.

6. A gas field ion source comprising:
    an emitter having a base part formed of a single crystal metal and a needle-like apex portion formed on the base part,
    wherein the apex portion of the emitter comprises a pyramid portion having an apex point, and a middle portion located between the pyramid portion and the base part, and
    wherein the pyramid portion of the emitter is a structure shaped like a triangular pyramid, and a cross section of the emitter at a line dividing the middle portion and the base part is substantially shaped like a hexagon;
    an extraction electrode having an opening at a location distant from the apex point of the emitter;
    a gas supply piping that supplies a gas to the pyramid portion of the emitter; and
    an extraction voltage application section that applies an extraction voltage between the emitter and the extraction electrode to form an electric field for ionizing the gas.

7. The gas field ion source according to claim 6,
    wherein, when the structure of the apex portion is broken, the apex portion can be regenerated by performing a regeneration process that includes an annealing step.

8. The gas field ion source according to claim 6,
    wherein, when the structure of the apex portion is broken, the shape of the apex portion of the emitter can be regenerated by performing a regeneration process that includes an annealing step, and wherein a cumulative change caused by the regeneration process in the extraction voltage required for ion emission from the emitter is not greater than 1%.

9. The gas field ion source according to claim 6, wherein the cross section shape is a shape of the apex portion viewed from the apex point side by scanning electron microscope image.

10. The gas field ion source according to claim 6, wherein the cross section shape is at a point within 1 μm from the apex point.

11. The gas field ion source according to claim 6, wherein the cross section dividing the middle portion and the base part is at a point at which a slope of the emitter, in a side view, changes when the emitter is seen from the base part toward the apex portion.

12. An ion beam device comprising:
a gas field ion source that emits ions;
an ion optical system that accelerates ions emitted from the gas field ion source to irradiate a sample with the accelerated ions;
a secondary particle detector that detects secondary particles emitted from the sample when the sample is irradiated with the ions;
an image generation section that generates a secondary particle image by associating a detection signal from the secondary particle detector with the positions of the ions irradiated on the sample; and
an indicator that displays the secondary particle image,
wherein the gas field ion source includes
an emitter having a base part formed of a single crystal metal and a needle-like apex portion formed on the base part,
wherein the apex portion of the emitter comprises a pyramid portion having an apex point, and a middle portion located between the pyramid portion and the base part, and
wherein the pyramid portion of the emitter is a structure shaped like a triangular pyramid, and a cross section of the emitter at a line dividing the middle portion and the base part is substantially shaped like a hexagon,
an extraction electrode having an opening at a location distant from the apex point of the emitter,
a gas supply piping that supplies a gas to a space between the apex point of the emitter and the extraction electrode, and
an extraction voltage application section that applies a voltage between the emitter and the extraction electrode.

13. The ion beam device according to claim 12, wherein, when the structure of the apex portion of the emitter is broken, the apex portion can be regenerated by performing a regeneration process that includes an annealing step.

14. The ion beam device according to claim 12, wherein the cross section shape is a shape of the apex portion viewed from the apex point side by scanning electron microscope image.

15. The ion beam device according to claim 12, wherein the cross section shape is at a point within 1 μm from the apex point.

16. The ion beam device according to claim 12, wherein the cross section dividing the middle portion and the base part is at a point at which a slope of the emitter, in a side view, changes when the emitter is seen from the base part toward the apex portion.

17. An ion beam device comprising:
a gas field ion source including an emitter that emits ions and an extraction electrode having an opening at a location distant from the apex point of the emitter;
an ion optical system that accelerates ions emitted from the gas field ion source to irradiate a sample with the accelerated ions;
a secondary particle detector that detects secondary particles emitted from the sample when the sample is irradiated with the ions;
an image generation section that generates a secondary particle image by associating a detection signal from the secondary particle detector with the positions of the ions irradiated on the sample; and
an indicator that displays the secondary particle image,
wherein the ion beam device further includes
an emitter regeneration means that regenerates the apex portion of the emitter by performing a regeneration process including an annealing step when the structure of the apex portion of the emitter of the gas field ion source is broken; and
a controller that compares the ratio between the amount of cumulative change in a voltage applied between the emitter and the extraction electrode and an acceleration voltage of the ion optical system against a predefined reference value to determine whether the axis of the ion optical system needs to be adjusted.

* * * * *